(12) United States Patent
Batinica et al.

(10) Patent No.: US 11,374,050 B2
(45) Date of Patent: Jun. 28, 2022

(54) FOCAL PLANE ARRAY DETECTORS WITH SELECTABLE POLARIZATION

(71) Applicant: Raytheon Company, Waltham, MA (US)

(72) Inventors: Michael J. Batinica, Ventura, CA (US); Bradly Eachus, Buellton, CA (US); Edward P. Smith, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 87 days.

(21) Appl. No.: 16/940,310

(22) Filed: Jul. 27, 2020

(65) Prior Publication Data
US 2022/0028917 A1 Jan. 27, 2022

(51) Int. Cl.
*H04N 5/369* (2011.01)
*H04N 5/351* (2011.01)
*H04N 5/378* (2011.01)
*H01L 27/146* (2006.01)

(52) U.S. Cl.
CPC .... *H01L 27/14652* (2013.01); *H01L 27/1465* (2013.01); *H01L 27/14625* (2013.01); *H04N 5/351* (2013.01); *H04N 5/378* (2013.01); *H04N 5/379* (2018.08)

(58) Field of Classification Search
CPC ......... H01L 27/14652; H01L 27/14625; H01L 27/1465; H04N 5/351; H04N 5/378; H04N 5/379
See application file for complete search history.

(56) References Cited

U.S. PATENT DOCUMENTS

| 8,772,729 | B1 | 7/2014 | Brown et al. |
| 9,184,198 | B1* | 11/2015 | Miao ................ H01L 27/14634 |
| 2018/0191932 | A1* | 7/2018 | Schubert ............... H04N 5/238 |
| 2020/0076999 | A1* | 3/2020 | Akiyama .......... H04N 9/04563 |
| 2021/0134886 | A1* | 5/2021 | Li ..................... H01L 27/14634 |
| 2021/0160463 | A1* | 5/2021 | Taguchi .............. H04N 9/0451 |
| 2021/0360132 | A1* | 11/2021 | Bikumandla ...... G02B 27/0172 |

FOREIGN PATENT DOCUMENTS

WO 20160112355 A2 7/2016

\* cited by examiner

*Primary Examiner* — Nhan T Tran
(74) *Attorney, Agent, or Firm* — Burns & Levinson LLP; Joseph M. Maraia

(57) ABSTRACT

A unit cell of a focal plane array (FPA) is provided. The unit cell includes a first layer having a first absorption coefficient. The first layer is configured to: sense a first portion of a polarized light of an incident light having a first portion and a second portion, convert the first sensed portion of incident light into a first electrical signal, and pass through a second portion of the incident light. Further, the unit cell includes a second layer having a second absorption coefficient and positioned adjacent to the first layer and configured to receive the second portion of the incident light. The second layer is configured to convert the second portion of the incident light to a second electrical signal. Also, the unit cell includes a readout integrated circuit positioned adjacent to the second layer and configured to receive the first electrical signal and the second electrical signal.

19 Claims, 5 Drawing Sheets

FOCAL PLANE ARRAY DETECTORS WITH SELECTABLE POLARIZATION

TECHNICAL FIELD

The application relates to image sensors and, more particularly, to focal plane array detectors for image sensors.

BACKGROUND

Image sensors are used by image capturing devices such as digital cameras and infrared imagers to capture images of an environment or terrain within the image sensor's field of view. A typical image sensor has an array of pixels and corresponding unit cells, referred to as a focal plane array (FPA) that receives light via a lens. The received light is captured by each pixel of the array while a corresponding unit cell accumulates an electric charge proportional to the light intensity at each pixel. The term "pixel" can refer to the light capturing element or the smallest portion of a quantized image produced by the capturing element. In an FPA, the pixels and their corresponding unit cells are typically arranged in a two-dimensional array by columns and rows.

Typically, a focal plane array is a rectangular two-dimensional array containing many thousands or even a several million unit cells. The unit cells includes a detector for sensing incident light such as either photodetectors, e.g., photodiodes, or thermal detectors, e.g. microbolometers. Hence, a unit cell may also be referred to as a focal plane array detector. Typically, each detector has dimensions between a few microns and a few tens of microns.

Each unit cell also includes electronic circuitry that accumulates an electrical charge from a detector in their associated pixel. The electrical charge corresponds to the amount of flux of light of various wavelengths captured by the detector in the associated pixel. A unit cell accumulates charge using an integration capacitor that integrates the accumulated charge over a time interval to produce a charge that is proportional of the flux intensity incident at a corresponding pixel for an integration period. A unit cell typically includes an analog or digital readout integrated circuit (ROIC). A conventional analog ROIC couples a capacitor to a detector. The capacitor is used to integrate charge or current from the detector over an integration period. FPAs using their unit cells operate by detecting photons at particular wavelengths and then generating an electrical charge, voltage, or resistance, i.e., an electrical signal, in relation to the number of photons detected at each pixel. This charge, voltage, or resistance is then measured, digitized, and used to construct an image of the object, scene, or phenomenon that emitted the photons.

Existing unit cells and their detectors are susceptible to glare or clutter, such as reflection off the ocean, which can obscure an image provided by an image sensor. Polarization techniques have been used for many years to reduce glare or white-out of images by filtering out portions of the light spectrum before detection and viewing by a user. While existing polarization techniques have reduced glare or white-out, such polarization approaches significantly reduce the light energy incident at the detectors of the unit cells of an FPA, resulting in reduce image contrast and quality. Existing image sensors have attempted to compensate for the energy loss by amplifying the polarized signals using amplifiers in the ROIC or image sensor. Unfortunately, such an approach has increased ROIC design complexity, ROIC costs, and introduced interfering noise that adversely affects the quality of images produced by conventional image sensors using mechanical or electrical polarization techniques.

SUMMARY

The application, in various implementations, addresses deficiencies associated with the performance of image sensor using conventional polarization techniques.

This application describes exemplary unit cell detectors that perform simultaneous detection of both orthogonal polarizations of incident light in a single unit cell detector while using a two-channel ROIC to detect a first polarized portion of the light incident at the detector and a second polarized or remaining portion of the light incident on the detector. The detector may be designed to selectively detect N portions of polarized or unpolarized incident light and include an N-channel ROIC to process each detector portion of the incident light. Such an approach of implementing a detector capable of sensing polarized light and enables a unit cell to capture nearly the full energy of incident light rather than introducing additional mechanical or electronic techniques to compensate for polarization signal losses, advantageously improves image quality without introducing adverse noise interference and also reduces system complexity and cost.

In one aspect of the disclosure, a unit cell of a focal plane array (FPA) includes a first layer having a first absorption coefficient. The first layer is configured to: i) sense a first portion of a polarized light of an incident light having a first portion and a second portion, ii) convert the sensed first portion of the polarized light into a first electrical signal, and iii) pass through a second portion of the incident light. Further, the unit cell includes a second layer having a second absorption coefficient. The second layer is positioned adjacent to the first layer. The second layer is also configured to receive the second portion of the incident light and to convert the second portion of the incident light to a second electrical signal. Further, the unit cell includes a readout integrated circuit (ROIC). The ROIC may be positioned adjacent to the second layer. The ROIC is also configured to receive the first electrical signal from the first layer and the second electrical signal from the second layer.

In some implementations, the ROIC may combine the first electrical signal and second electrical signal into a combined electrical signal. The combined electrical signal may be substantially equal to an electrical signal corresponding to an energy of the incident light.

In one implementation, the unit cell includes a third layer positioned between the first layer and the second layer. In some implementations, the third layer is a mechanical polarizer. The third layer may be configured to reflect a first amount of the first portion of the incident light to the first layer. In some implementations, the third layer is configured to pass a second amount of the first portion of the incident light to the second layer.

The first and second layers may include a material that absorbs radiation of the desired wavelength and converts it to electrical signal, such as, silicon, InGaAs, HgCdTe, InSb, or III-V Superlattices, or a combination of these materials with metals and/or oxides to form metamaterials. The third layer may include a silicon oxide. The unit cell may include a reflector layer to reflect a first amount of the second portion of the incident light to the second layer and pass a second amount of the second portion of the incident light to the ROIC. The reflector layer may be positioned on the ROIC adjacent to the second layer. In some implementations, the reflector layer includes a step structure and is positioned on the second layer adjacent to the ROIC.

The unit cell may include a polarizer adjacent to the first layer. The polarizer may be configured to polarize a first section of the incident light to provide the polarized signal and to pass the polarized signal and the incident light to the first layer.

In another aspect, a method for image sensing includes providing a first layer having a first absorption coefficient for a given polarization, and sensing, at the first layer, a first portion of a polarized light of an incident light having a first portion and a second portion. Further, the method includes converting, at the first layer, the first portion of incident light into a first electrical signal and passing through the first layer a second portion of the incident light. In addition, the method includes receiving the second portion of the incident light at a second layer having a second absorption coefficient, converting, at the second layer, the second portion of the incident light to a second electrical signal, and receiving, at a readout integrated circuit (ROIC), the first electrical signal from the first layer and the second electrical signal from the second layer.

In one implementation, the method includes combining, either at the ROIC or externally, the first electrical signal and second electrical signal into a combined electrical signal. The combined electrical signal may be equal to an electrical signal corresponding to an energy of the incident light. The method may include positioning a third layer between the first layer and the second layer. The method may include reflecting, at the third layer, a first amount of the first portion of the incident light toward the first layer.

In a further aspect, an image sensor includes an image processing circuit and an array of unit cells coupled to the image processing circuit. Each unit cell includes a first layer having a first absorption coefficient, where the first layer is configured to: i) sense a first portion of a polarized light of an incident light having a first portion and a second portion, ii) convert the sensed first portion of the polarized light into a first electrical signal, and iii) pass through a second portion of the incident light. Each unit cell also includes a second layer having a second absorption coefficient, where the second layer is positioned adjacent to the first layer and configured to receive the second portion of the incident light. The second layer is also configured to convert the second portion of the incident light to a second electrical signal. Further, each unit cell includes an ROIC positioned adjacent to the second layer that is configured to receive the first electrical signal from the first layer and the second electrical signal from the second layer.

BRIEF DESCRIPTION OF THE DRAWINGS

Various aspects of the present disclosure are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The figures are provided for the purposes of illustration and explanation and are not intended as a definition of the limits of the invention.

DETAILED DESCRIPTION

Figure 1:
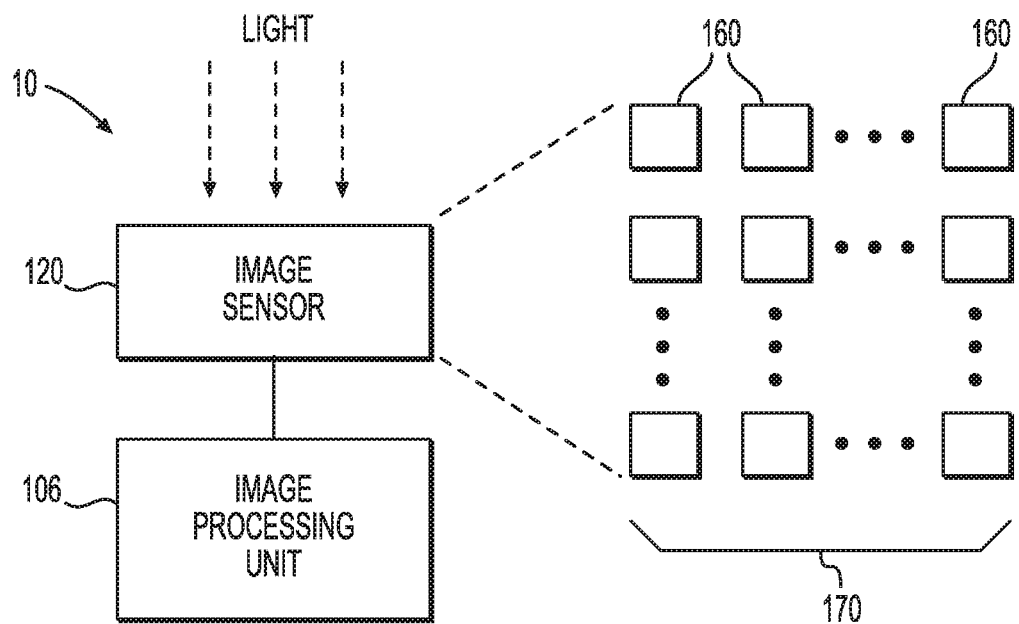
FIG. 1 is a block diagram illustrating an image capture device.

The application, in various aspects, addresses deficiencies associated the existing polarization techniques for image sensors. In the following detailed description, numerous specific details are set forth in order to provide a thorough understanding of the aspects of the present disclosure. It will be understood by those of ordinary skill in the art that these aspects may be practiced without some of these specific details. In other instances, well-known methods, procedures, components and structures may not have been described in detail so as not to obscure the described aspects.

The present disclosure provides an imaging sensor which includes an FPA. As discussed above, an FPA includes an array of light detectors that detect photons within a specific wavelength range and generate an electrical signals. That is, each detector or unit cell detects over a specific wavelength range of light and produces an electrical signal which relates to the integrated photons over the wavelength range. These signals pass to an image processor to generate an image and/or image data. Therefore, each unit cell corresponds to a pixel element or a picture element in the final image. A FPA may be fabricated using silicon, InGaAs, HgCdTe, InSb, III-V Superlattice, or other materials providing absorption over the desired wavelength ranges, including a combination of these materials with metals and/or oxides to form metamaterials. Therefore, the FPA can be made of any semiconductor compound that converts photons in the desired wavelength range into charge carriers that can be collected by the ROIC.

Image sensors have different applications. For example, they can be used in Laser Detection and Ranging (LADAR) or LIDAR imaging. LADAR is a method for measuring distances by illuminating the target with laser light and measuring the reflection with a sensor. Differences in laser return times and wavelengths can then be used to make a three-dimensional (3-D) representation of the target.

Polarization offers numerous benefits, not only in detecting a geometry and surface of a terrain or object, but also in measuring physical properties that are not detectable using conventional imaging. It can be used to enhance the contrast for objects that are difficult to distinguish otherwise. Like human eyes, silicon cannot determine light polarization. Therefore, a polarization filter may be implemented in front of an FPA image sensor such that the image sensor detects the intensity of light with the polarization state defined by the filter. Currently, mechanical polarizers or electrically induced polarizers are being used in FPA image sensors. However, using these conventional polarizers causes a significant loss of signal or energy. To minimize this loss of signal, an amplifier can be used. However, using an amplifier can cause noise and increase cost.

The present disclosure describes a unit cell that absorbs selective polarization of the incident light without a mechanical or electrically induced polarizer so it eliminates noise and reduces cost. The inventive FPA unit cell or detector of the present disclosure includes a unit cell detector with one or more layers where each layer has a distinctive absorption coefficient, which results in a distinctive absorption of a selective polarization of the incident light at the detector. That is, each detector is made of a material with one or more layers of material that may each include a specific absorption coefficient so as to absorb specific polarization over a wavelength range of light.

FIG. 1 is a block diagram illustrating an image capture device 10 that may be used to capture images according to aspects described herein. For example, device 10 may be a digital camera, video camera, or other photographic and/or image capturing equipment. Image capture device 10 may include image sensor 120 and image processing unit (circuit) 106. Image sensor 120 may be an FPA or other suitable light sensing device that can capture images. Image processing unit 106 may be a combination of hardware, software, and/or firmware that is operable to receive signal information from image sensor 120 and convert the signal information into a digital image.

Image sensor 120 may include an array 170 of unit cells 160. Each unit cell 160 accumulates charge proportional to the light intensity at that location in the field of view and provides an indication of the intensity of light at that location to the image processing unit 106. Each unit cell 160 may correspond to a pixel in the captured electronic image. Each unit cell 160 and/or detector may include a multilayer polarizer and/or absorber that provides at least two electrical signal outputs that correspond to polarized and unpolarized light simultaneously. Each unit cell and/or detector 160 may include a dual-channel ROIC arranged to receive and process the two electrical signals simultaneously. In some implementations, each unit and/or detector 160 may include an N-channel detector configured to separate N portions of incident light into N electrical signals that are then processed by an N-channel ROIC.

Figure 2:
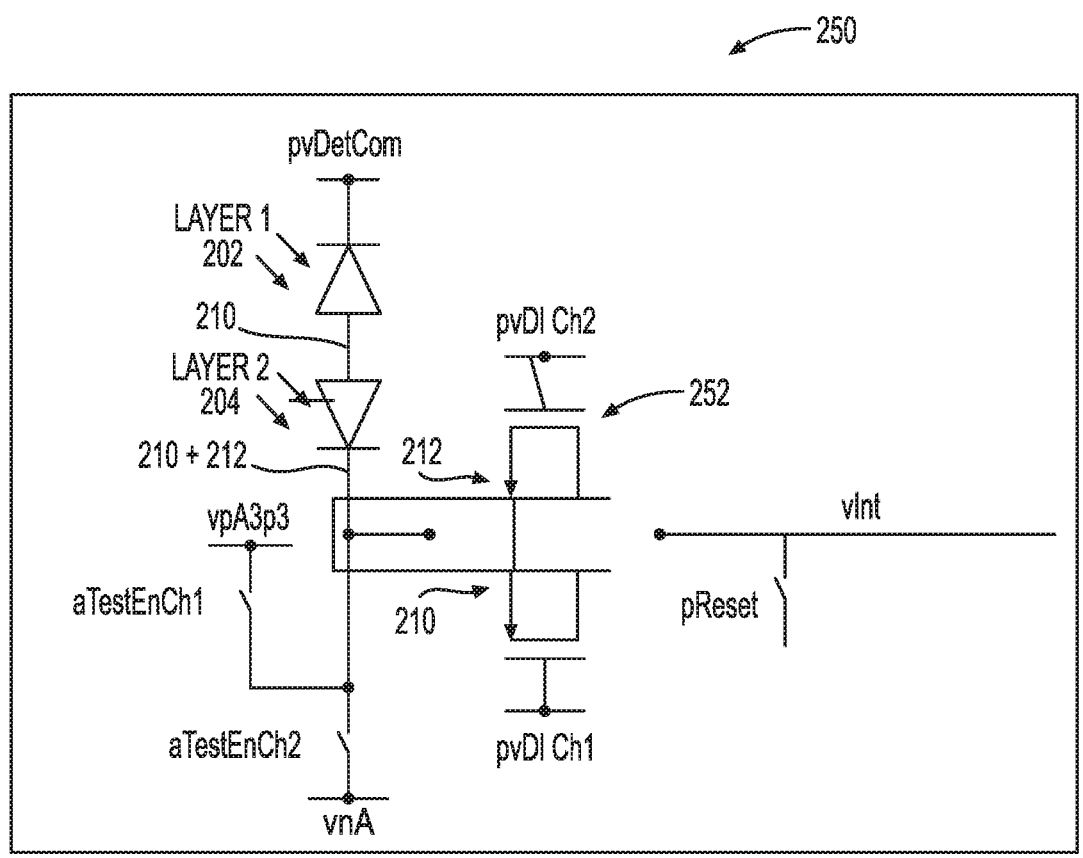
FIG. 2 is a block diagram illustrating a ROIC of a unit cell.
Figure 3:
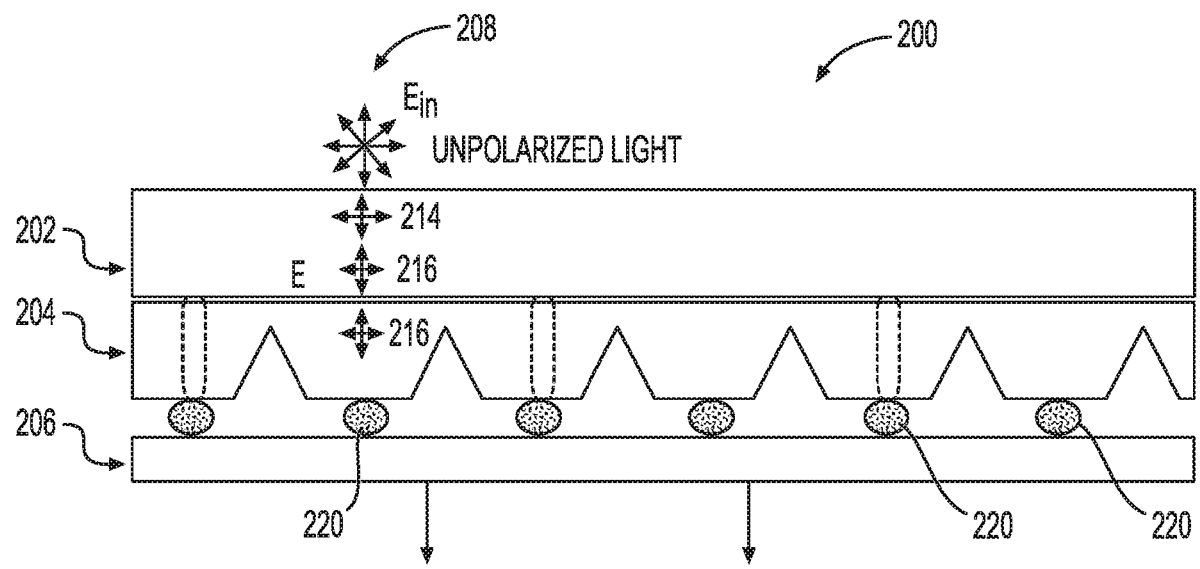
FIG. 3 illustrates a cross sectional view of a unit cell of a focal plane array (FPA)

FIG. 2 is a circuit diagram 250 of ROIC 206 of detector and/or unit cell 200. FIG. 3 is a cross sectional view of a unit cell 200 having ROIC 206 and detection layers 202 and 204, according to aspects described herein. The ROIC 206 interfaces with first layer 202 of detector 200 with a first absorption coefficient. When the first layer 202 receives the incident light 208, it absorbs a select polarization, e.g., first portion 214, of the incident light 208 and converts that polarized portion to a first electrical signal 210. The first layer 202 of detector 200 is also capable of passing through a second portion 216 of the incident light 208.

As shown in FIGS. 2 and 3, detector 200 includes a second layer 204 in electrical communication with ROIC 206. The second layer 204 has a second absorption coefficient. The second layer 204 is positioned adjacent to the first layer 202 and receives the second portion 216 of the incident light 208 which has passed through the first layer 202. Depending on the absorption coefficient of the second layer 204, the second portion 216 of the incident light 208 can pass through the second layer 204, be partially polarized, or completely polarized. Accordingly, the second layer 204 converts the second portion 216 of the incident light to a second signal 212. The first layer 202 and the second layer 204 can be made of various materials, e.g., silicon, InGaAs, HgCdTe, InSb, or metamaterials such as III-V Superlattices.

As stated above, one of the novel features of the present disclosure is having an imaging sensor without a need for mechanical polarizer or other loss mechanism. As the detector material of the unit cell of the sensor is made of various layers, each layer may absorb a portion of a preferential polarization of the incident light and pass through or reflect the other portion. The incident light is an electromagnetic wave with a wavelength range. The electromagnetic waves propagate in different directions. When the incident light, which is an un-polarized light is incident at detector 200, the first layer 202 absorbs a portion of the incident light of the electromagnetic waves with a predefined direction/polarization. This phenomena depends on the absorption coefficient or coupling efficiency of the material which the first layer 202 is made from. The rest of the incident light passes through the first layer 202. When the second layer 204 receives the other portion of the incident light that passed through the first layer 202, the second layer 204 absorbs a portion of that light with the electromagnetic waves in a specific direction, depending on its absorption coefficient. As a result, the exemplary unit cell and/or detector 200 minimizes a signal loss. The unit cell and/or detector 200 of FIG. 3 includes two layers 202 and 204, however, the unit cell and/or detector 200 may have any number of layers more than two layers. Each layer can have a distinctive absorption coefficient and, therefore, absorbs different polarization of light.

Further, as shown in FIG. 3, ROIC 206 is positioned adjacent to the second layer 204. The ROIC 206 is connected to the second layer 204 by connectors 220. The connector 220 can be indium interconnects for flip-chip bonded FPAs, or metal posts in the case of Direct Bond Hybridization (DBH). The ROIC 206 receives the first electrical signal 210 from the first layer 202 and the second electrical signal 212 from the second layer 204. ROIC 206 may include a detector circuit 252 having, for example, an analog-to-digital (ADC) converter and/or a direct injection (DI) circuit to convert each independent electrical signal from layers 202 and 204 into a unit cell output value for an image sensor. Therefore, the ROIC receives electrical signal corresponding to both detector layers in proportion to the amount of polarized and/or un-polarized light absorbed in each.

The first electrical signal 210 and the second electrical signal 212 is substantially equal to an electrical signal corresponding to an energy of the incident light 208.

Figure 4:
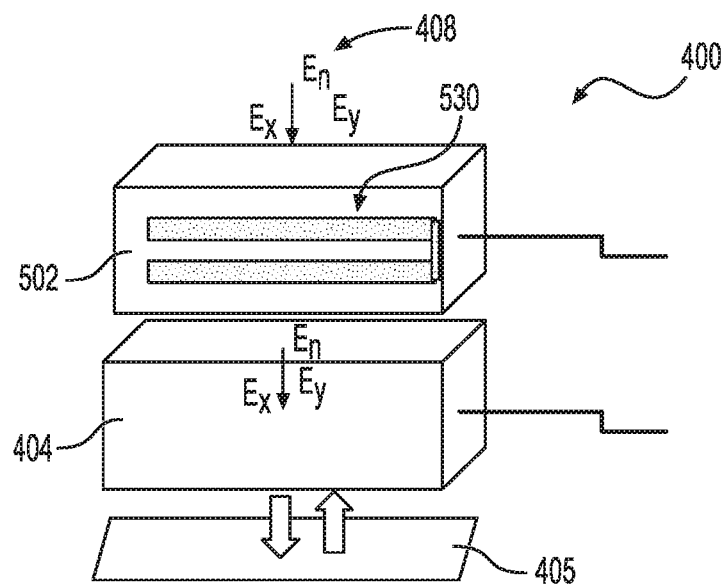
FIG. 4 illustrates a cross sectional view of a unit cell.

FIG. 4 includes a conceptual diagram of a of unit cell 500 employing a micro-antenna like structure 530 tuned for a desired wavelength and polarization. Structure 530 may be implemented as a metal structure patterned on the surface of layer 502, or layer 502 may be etched to form a step structure with or without metals applied after etching. The geometry of the antenna structure 502 may be optimized to tune the wavelength and/or polarization of light that is most strongly absorbed by layer 502. The structure of the unit cell 500 is similar to an antenna structure where layer 502 receives incident light 408 and couples one polarization ($E_y$), then and generates photoelectrons which are swept off for integration. This can be expressed as:

$$i_1 \propto |\gamma E_y|^2$$

The remaining light passes through the layer 502. A layer 404 of the structure 400 receives the remaining light and absorbs both polarization ($E_y$ and $E_x$) and generates photoelectrons which are swept off for integration. This can be expressed as:

$$i_2 \propto |(1-\gamma) E_y|^2 + |E_x|^2$$

A reflector 405 receives the light which passed through the layer 404 and reflects it back to the layer 404.

The total energy can be expressed as the sum of both layer 502 and 404:

$$i_{total} \propto i_1 + i_2 \quad P \propto i_1/(i_1+i_2)$$

This micro-antenna structure 530 can be built on the detector structure 502. In some implementations, micro-antenna structure 530 is formed on connectors 520.

Figure 5:
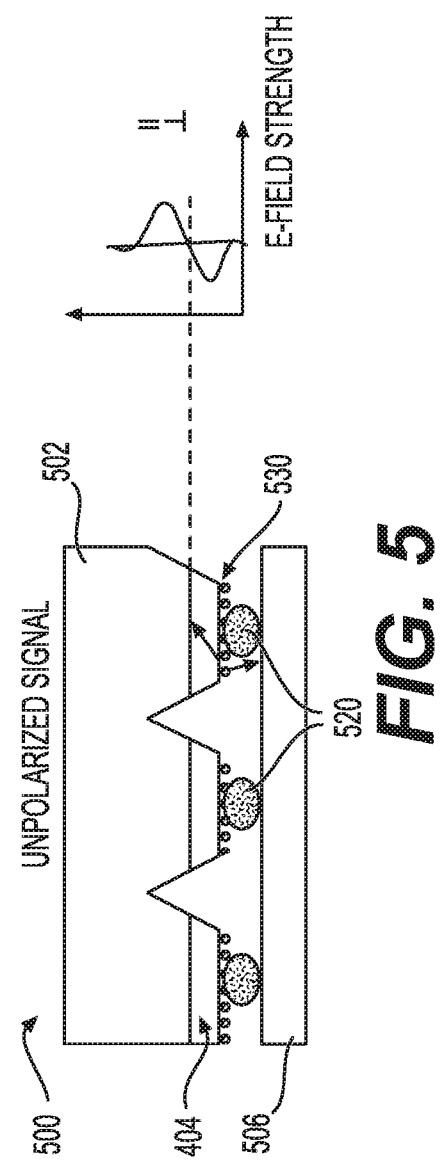
FIG. 5 illustrates a cross sectional view of a unit cell.

FIG. 5 illustrates a cross sectional view of a unit cell 500 showing a detector absorber layer 502, connectors 520, micro-antenna structure 530 positioned adjacent to detector absorber layer 404, and ROIC 506. FIG. 5 also illustrates how a portion of incident light is reflected back toward absorber layer 404 by micro-antenna structure 530. FIG. 5 shows how micro-antenna structure 530 may be built into a unit cell via, for example, etching or other application.

Figure 6:
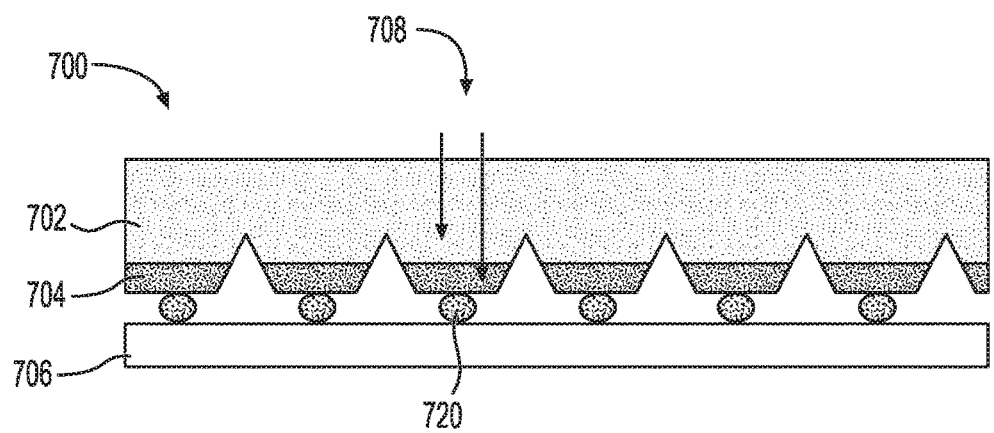
FIG. 6 illustrates a cross sectional view of a unit cell.

FIG. 6 illustrates a cross sectional view of unit cell 700 including a detector absorber 702 that is grown or modified such that molecular dipoles may be oriented and absorb one polarization of light more strongly than another portion of light. The unit cell 700 includes a first layer 702 with a first absorption coefficient, a second layer 704 with a second absorption coefficient positioned adjacent to the first layer 702, and a ROIC 706 positioned adjacent to the second layer 704. When the first layer 702 receives the incident light 708, it polarizes a first portion of the incident light 708 and converts that polarized portion to a first electrical signal. The first layer 702 is also capable of passing through a second portion of the incident light 208. The second layer 704 converts the second portion of the incident light to a second signal. According to this aspect of the disclosure, the first layer 702 is grown or modified such that their molecular dipoles are preferentially oriented and absorb one polarization of the light more strongly than the other. The ROIC 706 receives both the first signal and the second signal. The ROIC 706 is connected to the second layer 704 through connectors 720.

Figure 7:
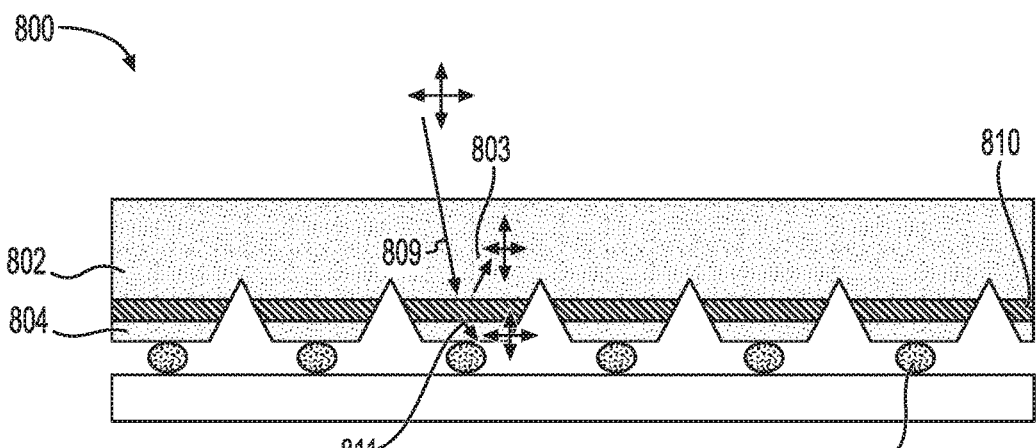
FIG. 7 illustrates a cross sectional view of a unit cell.

FIG. 7 is a cross sectional view of a unit cell 800 including a mechanical polarizer or MEMS device place between detection layers 802 and 804 that reflects one polarization of light 803 back into layer 802 on the incident side, and transmits an opposite polarization of light 811 into the second layer 804. The unit cell 800 includes a first layer 802, a second layer 804, and a third layer 810 positioned between the first layer 802 and the second layer 804. The first layer 802 of the unit cell 800 receives the incident light 808 and is capable of absorbing a portion of the incident light 808 and generating a first electrical signal. After the incident light 808 or a first portion 809 of the incident light 808 passes through the first layer 802 it reaches the third layer 810. Then the third layer 810 which is a polarizer, reflects a polarized first amount 813 of the first portion 809 of the incident light to the first layer 802. The third layer 810 passes an oppositely polarized second amount 811 of the first portion 809 of the incident light 808 to the second layer 804.

Further, the second layer 804 receives the portion of the light 811 and is capable of absorbing the second portion 811 and generating a second signal. The second layer 804 is in contact with ROIC 806 through connectors 820. The ROIC receives the first and the second signal through connectors 820. The third layer 810 can be fabricated on the first layer 802. In some implementations, the third layer 810 is a mechanical polarizer.

Figure 8:
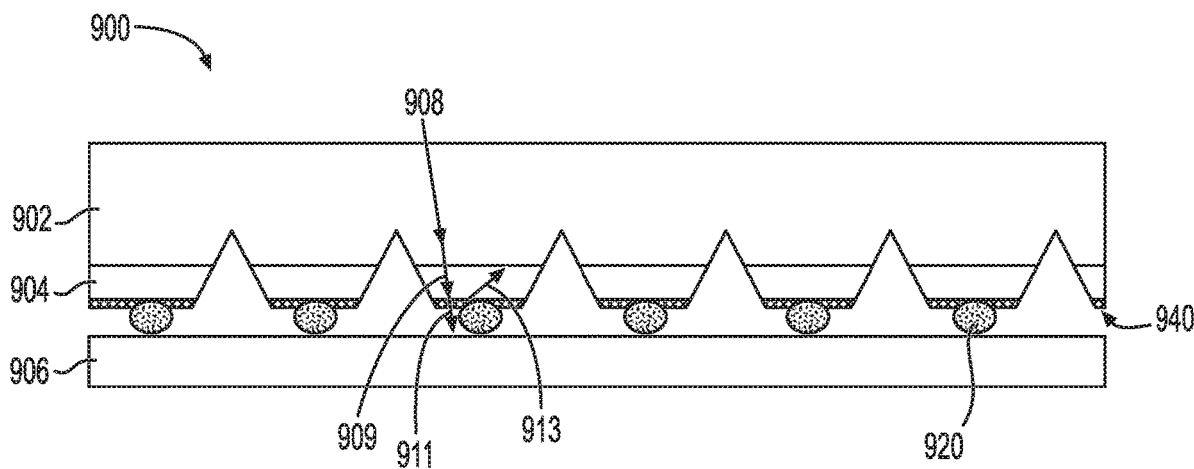
FIG. 8 illustrates a cross sectional view of a unit cell.

FIG. 8 is a cross sectional view of a unit cell 900 including a reflector 940 built into pixel contact metal or the ROIC 906 surface that reflects polarized light back into the detection layers to provide a polarized second pass of absorption. The unit cell 900 includes a first layer 902, a second layer 904 positioned adjacent to the first layer 902, and a reflector layer 940 positioned adjacent to the second layer 904. The first layer 902 and the second layer 904 can have different absorption coefficients. The first layer 902 of the unit cell 900 receives the incident light 908 and converts it to a first electrical signal. In some implementations, the first layer 902 passes through all of the incident light 908. In another implementations, the first layer 902 passes a portion of the incident light 908. As shown in FIG. 8, the second layer 904 receives a second portion 909 of the incident light 908 and generates a second signal. The second portion 909 passes through the second layer and reaches the reflector layer 940. The reflector layer 940 can reflect a first amount 913 of the second portion 909 of the incident light 908 to the second layer 904 and pass a second amount 911 of the second portion 909 of the incident light 908 to a ROIC 906. The ROIC 906 is positioned adjacent to the second layer 904. The reflector layer 940 can be fabricated on the second layer 904. The reflector layer 940 can be fabricated as a step structure as shown in FIG. 8. In some implementations, the reflector layer 940 is fabricated on connectors 920. Connector 920 connects the second layer 904 to the ROIC 906.

Figure 9:
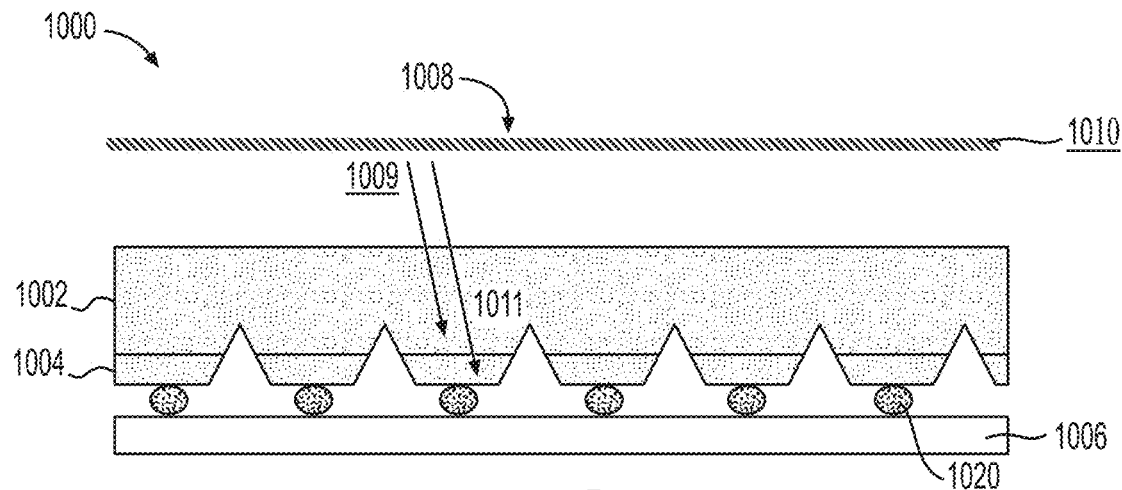
FIG. 9 illustrates a cross sectional view of a unit cell.

FIG. 9 is a cross sectional view of a unit cell 1000 using a mechanical polarizer and/or MEMS device 1010 that polarizes light based on wavelength, with the transition wavelength placed between two spectral channels of the detector. The unit cell 1000 includes mechanical and/or MEMS polarizer 1010, a first layer 1002 adjacent to the polarizer, a second layer 1004 positioned adjacent to the first layer 1002, and a ROIC 1006 positioned adjacent to the second layer 1004. The ROIC 1006 is connected to the second layer 1004 by connectors 1020. In some implementations, the polarizer 1010 is in contact with the first layer 1002. In other implementations, the polarizer 1010 is not in contact with the first layer 1002. The polarizer 1010 polarizes a first section of the incident light 1008 to provide the polarized signal 1011. Both the polarized signal 1011 and a second section 1009 of the incident light 1008 pass to the first layer 1002. The first layer 1002 receives both the polarized signal 1011 and the second section 1009 and converts that to a first electrical signal. The second layer receives a portion of the polarized signal 1011 and the second section 1009 and converts it to a second electrical signal. ROIC 1006 receives both the first and second electrical signals from the first layer 1002 and the second layer 1004, respectively.

Figure 10A:
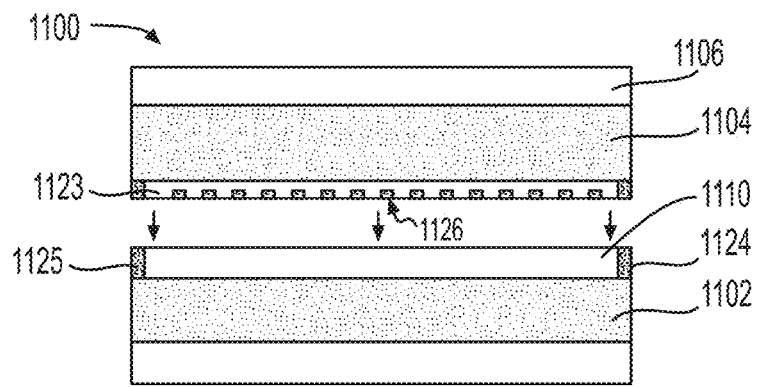
FIGS. 10A-10B illustrate a side view of a MEMS device of FIG. 7.
Figure 10B:
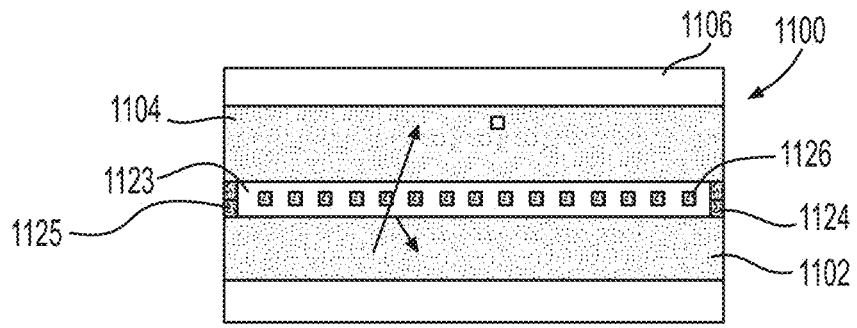

FIGS. 10A and 10B are cross sectional views of a MEMS device of FIG. 7. FIG. 10A illustrates the MEMS unit cell 1100 before bonding. FIG. 10B shows the MEMS unit cell 1100 after bonding. Referring to FIG. 10A, the unit cell 1100 includes a first layer 1102. A bonding oxide layer 1110 is coated on the first layer 1102. Wire grids 1124 and 1125 are fabricated on the sides of the bonding oxide layer 1110 and on the first layer 1102. A second layer 1104 is fabricated on a ROIC 1106 which is made of silicon. Then a third layer 1123, a silicon oxide layer, is fabricated on the second layer 1104. As shown, wire grids 1126 are fabricated on the third layer 1123. The wire grids 1126 are metal wires which are the polarizer features of the third layer 1123. FIG. 10B shows the unit cell 1100 after bonding of the two oxide layers 1110 and 1123.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

Although the present disclosure has been described herein with reference to particular embodiments, the present disclosure is not intended to be limited to the particulars disclosed herein; rather, the present disclosure extends to all functionally equivalent structures, methods and uses, such as are within the scope of the claims.

What is claimed is:

1. A unit cell of a focal plane array (FPA) comprising:
   a first layer having a first absorption coefficient, the first layer configured to: i) sense a first portion of a polarized light of an incident light having a first portion and a second portion, ii) convert the sensed first portion of the polarized light into a first electrical signal, and iii) pass through a second portion of the incident light;
   a second layer having a second absorption coefficient, the second layer positioned adjacent to the first layer and configured to receive the second portion of the incident light, wherein the second layer is configured to convert the second portion of the incident light to a second electrical signal;
   a readout integrated circuit (ROIC) positioned adjacent to the second layer and configured to receive the first electrical signal from the first layer and the second electrical signal from the second layer; and
   a reflector layer to reflect a first amount of the second portion of the incident light to the second layer and pass a second amount of the second portion of the incident light to the ROIC.

2. The unit cell of claim 1, wherein the ROIC combines the first electrical signal and second electrical signal into a combined electrical signal.

3. The unit cell of claim 2, wherein the combined electrical signal is substantially equal to an electrical signal corresponding to an energy of the incident light.

4. The unit cell of claim 1 further comprising a third layer positioned between the first layer and the second layer.

5. The unit cell of claim 4, wherein the third layer is a mechanical polarizer.

6. The unit cell of claim 4, wherein the third layer is configured to reflect a first amount of the first portion of the incident light to the first layer.

7. The unit cell of claim 4, wherein the third layer is configured to pass a second amount of the first portion of the incident light to the second layer.

8. The unit cell of claim 1, wherein the first layer comprises at least one of a metal, silicon oxide, InGaAs, HgCdTe, InSb, and III-V Superlattice.

9. The unit cell of claim 1, wherein the second layer comprises at least one of a silicon oxide, InGaAs, HgCdTe, InSb, and III-V Superlattice.

10. The unit cell of claim 1, wherein the reflector layer is positioned on the ROIC adjacent to the second layer.

11. The unit cell of claim 1, wherein the reflector layer comprises a step structure and is positioned on the second layer adjacent to the ROIC.

12. The unit cell of claim 1 further comprises a polarizer adjacent to the first layer, the polarizer is configured to:
    polarize a first section of the incident light to provide the polarized signal; and
    pass the polarized signal and the incident light to the first layer.

13. A method for image sensing comprising:
    providing a first layer having a first absorption coefficient;
    sensing, at the first layer, a first portion of a polarized light of an incident light having a first portion and a second portion;
    converting, at the first layer, the sensed first portion of the polarized light of the incident light into a first electrical signal;
    passing through the first layer a second portion of the incident light;
    receiving the second portion of the incident light at a second layer having a second absorption coefficient;
    converting, at the second layer, the second portion of the incident light to a second electrical signal;
    receiving, at a readout integrated circuit (ROIC), the first electrical signal from the first layer and the second electrical signal from the second layer; and
    reflecting, via a reflector layer, a first amount of the second portion of the incident light to the second layer; and
    passing a second amount of the second portion of the incident light to the ROIC.

14. The method of claim 13 comprising combining, at the ROIC, the first electrical signal and second electrical signal into a combined electrical signal.

15. The method claim 14, wherein the combined electrical signal is substantially equal to an electrical signal corresponding to an energy of the incident light.

16. The method of claim 13 further comprising positioning a third layer between the first layer and the second layer.

17. The method of claim 16, wherein the third layer is a mechanical polarizer.

18. The method of claim 16 further comprising reflecting, at the third layer, a first amount of the first portion of the incident light toward the first layer.

19. An image sensor comprising:
    an image processing circuit; and
    an array of unit cells coupled to the image processing circuit, each unit cell comprising:
    a first layer having a first absorption coefficient, the first layer configured to: i) sense a first portion of a polarized light of an incident light having a first portion and a second portion, ii) convert the sensed first portion of the polarized light into a first electrical signal, and iii) pass through a second portion of the incident light;
    a second layer having a second absorption coefficient, the second layer positioned adjacent to the first layer and configured to receive the second portion of the incident light, wherein the second layer is configured to convert the second portion of the incident light to a second electrical signal;
    a readout integrated circuit (ROIC) positioned adjacent to the second layer and configured to receive the first electrical signal from the first layer and the second electrical signal from the second layer; and a reflector layer to reflect a first amount of the second portion of the incident light to the second layer and pass a second amount of the second portion of the incident light to the ROIC.

\* \* \* \* \*